(12) United States Patent
Lin

(10) Patent No.: US 6,735,075 B1
(45) Date of Patent: May 11, 2004

(54) REMOVABLE CASING FOR MEMORY CARD

(75) Inventor: Anderson Lin, Hsin Tien (TW)

(73) Assignee: D&C Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 10/411,261

(22) Filed: Apr. 11, 2003

(51) Int. Cl.⁷ .................................................. H05K 7/20
(52) U.S. Cl. .................... 361/679; 361/740; 312/223.2; 439/946
(58) Field of Search ................................. 361/679–687, 361/724–727, 740–749; 312/223.1–223.2; 439/76.1, 946, 159

(56) References Cited

U.S. PATENT DOCUMENTS 5,846,092 A * 12/1998 Feldman et al. ........... 439/76.1
6,172,867 B1 * 1/2001 Satou et al. ................ 361/680
6,365,832 B1 * 4/2002 Staron et al. .............. 174/52.1

* cited by examiner

Primary Examiner—Hung Van Duong

(57) ABSTRACT

The invention herein relates to a removable casing for memory card includes: an upper cover, a casing, a frontal cover and a lower cover wherein the casing is devised with a linkage terminal to be in contact with a memory card, the front of the casing is to receive the frontal cover while on either side of the casing extends a rod. The top and the bottom of the rod are each fitted with a plurality of notches, while on either side of the upper cover is at least one "U shape" catch and on either side of the lower cover is at least one "Inverse L shape" catch. The catches are to correspond to the notches for a match interlocking. The inside edges of rods are connected to a press board to exert pressure onto the linkage terminals to enhance the perfect evenness and overall steadiness of the terminals.

4 Claims, 4 Drawing Sheets

REMOVABLE CASING FOR MEMORY CARD

BACKGROUND OF THE INVENTION

1) Field of the Invention

The invention relates to a removable casing for memory card made for easy rigging and dismantling of the casing in order to facilitate inspection or repairing of the memory card.

2) Description of the Prior Art

As personal computers gain increasing popularity, the demand on the personal computer, its accessories and supplementary equipments escalate with time. To make the personal computer more versatile, manufacturers continuously furnish computer-related products and accessories such as: mouse, keyboard, scanner, digital camera, printer and etcetera where all above products need to be linked to the computer. Quality of the linkage, its assembly and linkage are therefore especially important.

In addition, a conventional memory card through repeated insertion and removal cycle tends to cause damage and deformation of its linkage terminals, results in inaccessibility to the internal memory section of the memory card. As all conventional memory card products on the market have the integrity that is not possible to dismantle, damage to any part of the memory card calls for total replacement of the card, causing both an economical burden for the user and a waste of the resources.

Such are the deficiencies of the conventional memory card linkage device in real applications, and therefore a ground for improvement.

The Applicant, having long experiences in related fields and fully aware of the deficiencies, undertakes the effort to devise a "removable casing for memory card" as a remedy to the above deficiencies.

SUMMARY OF THE INVENTION

The invention herein is to provide a removable casing for memory card, specifically an innovative type that facilitates inspecting and repairing of the memory card in order to enhance the application convenience and effectively prolong the products life expectancy, avoiding waste.

To accomplish such goal, the invention herein furnishes a removable casing for memory card comprises: an upper cover, a casing, a frontal cover and a lower cover wherein the casing is devised with a linkage terminal to be in connection with a memory card, the front of the casing is to receive the frontal cover while on either side of the casing extends a rod. The top and the bottom of the rod are each fitted with a plurality of notches, while on either side of the upper cover is at least one "U shape" catch and on either side of the lower cover is at least one "Inverse L shape" catch. The catches are to correspond to the notches for a match interlocking.

To further illustrate the character and the technical content of the present invention to this Review Board, please refer to the explanation and attached drawings, though the drawings only serve to collaborate the explanation and are for references only. It is by no means restrictive of the embodiment shown therein.

BRIEF DESCRIPTION OF THE DRAWINGS

To enable a further understanding of the said objectives and the technological methods of the invention herein, the brief description of the drawings below is followed by the detailed description of the preferred embodiments.

DETAILED DESCRIPTION OF THE PREFERRED EMBODIMENT

Figure 1:
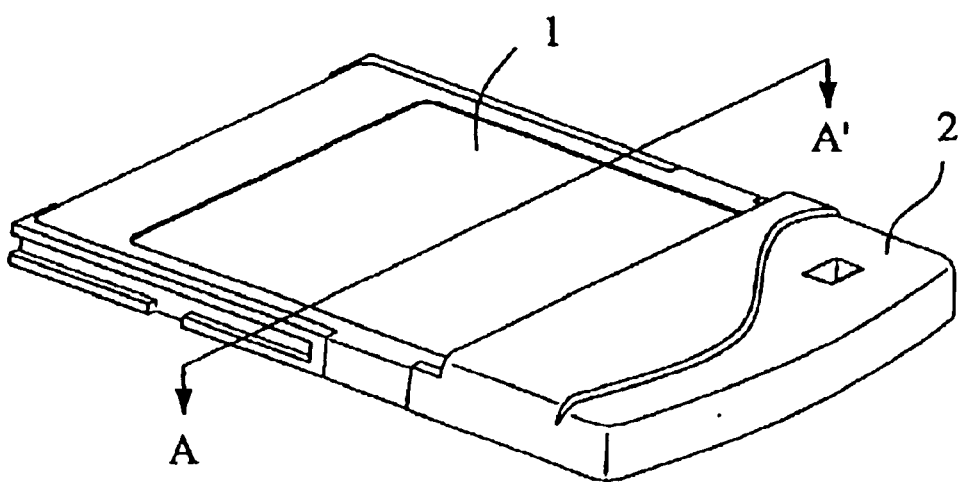
FIG. 1 is a perspective view showing a ready assembled embodiment of the present invention.
Figure 2:
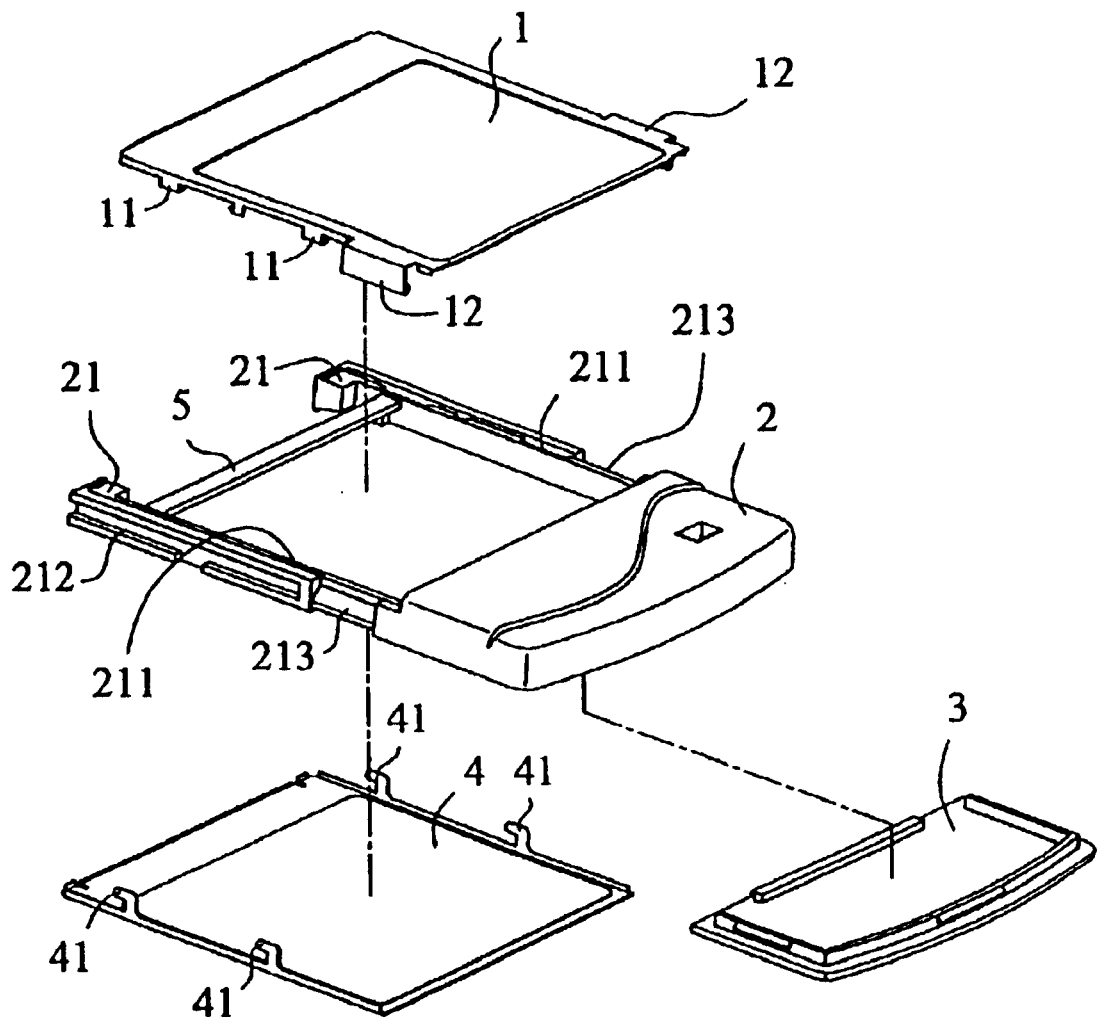
FIG. 2 is a perspective exploded view showing an entire assembly of components of the present invention.

Referring to FIG. 1 where a perspective view shows the present invention of a removable casing for memory card fully assembled, while FIG. 2 is a perspective exploded view showing the structure and components of said invention. The invention herein is a removable casing for memory card that is easy to dismantle for inspecting and repairing effort, wherein the removable casing for memory card comprises: an upper cover (1), a casing (2), a frontal cover (3) and a lower cover (4) while the casing (2) is fitted with a memory card circuit board that can electrically connect to the memory card. The two outer edges of casing (2) each extends into a rod (21) where a notch (213) is formed in the front segment of rod (21), pointed outward. The middle segment of rod (21) grows out into a notch track (211) from top to bottom at least in one place; the outside edge of rod (21) has a slide track (212) to allow the upper cover (1) to slide in and out. The frontal end of casing (2) forms into one single bulge to enhance the overall structural integrity to avoid any deformation while allowing the frontal cover (3) to fit in.

Figure 3:
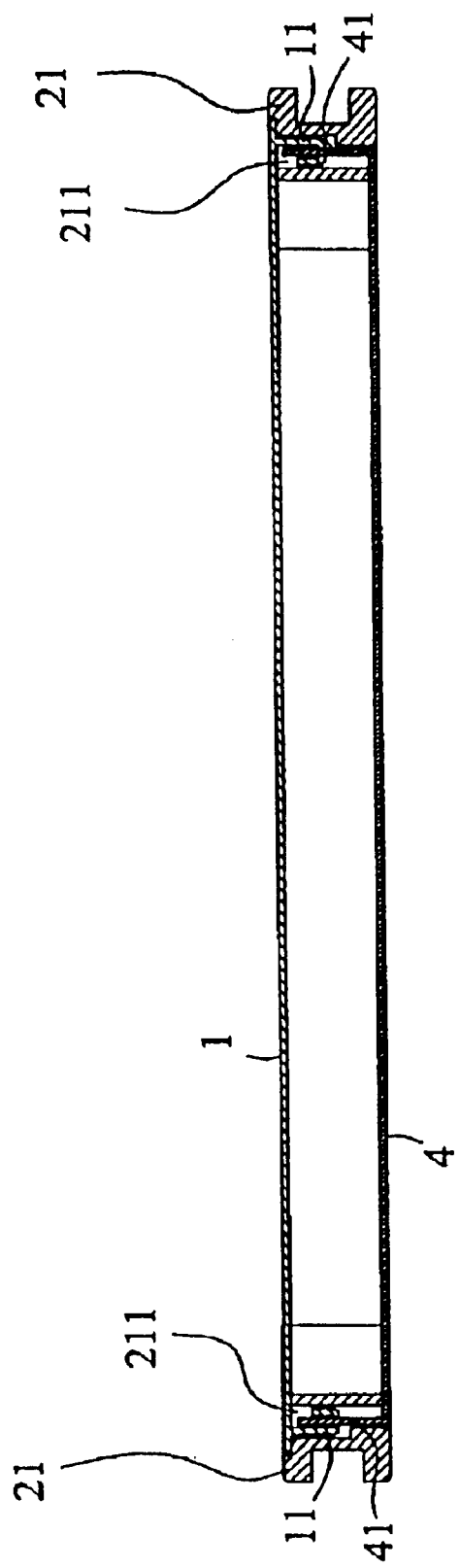
FIG. 3 is a cross-sectional view taken from line A–A' of FIG. 1 the present invention.
Figure 4:
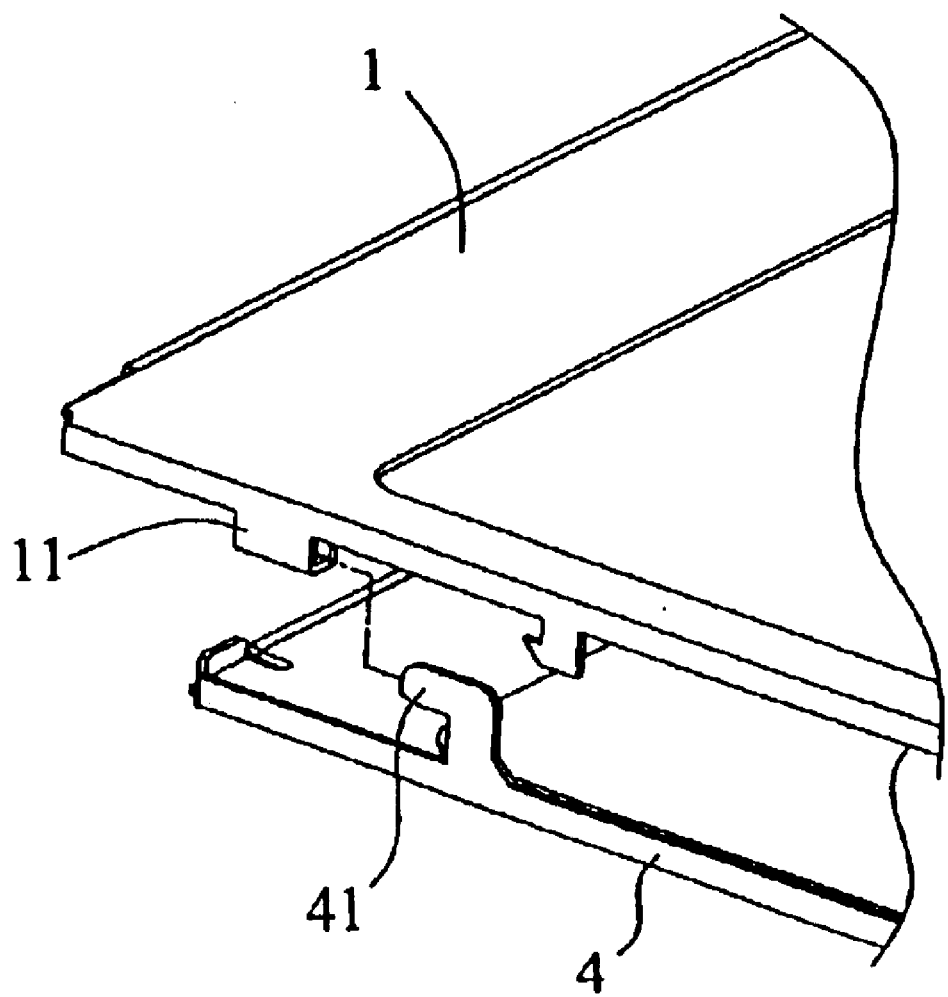
FIG. 4 is a perspective enlarged and exploded view showing the upper and lower covers are being connected according to the present invention.

Referring to FIG. 3 where a cross-sectional view of section line A–A' (see FIG. 1) is shown, while FIG. 4 is an enlarged perspective view showing the connection detail of the upper and lower covers. The present invention devises at least one "U shape" catch (11) on either side of upper cover (1) while on the corresponding position of the "U shape" catch on either side of lower cover (4) there is at least one "Inverse L shape" catch. The "U shape" catch (11) and the "Inverse L shape" catch (41) are each individually to correspond to the top and bottom of catch track (211) on rod (21) in order to match interlock the upper cover (1) and lower cover (4).

Again, referring to FIG. 2 the perspective exploded view of the entire assembly wherein a plate (12) is shown on the frontal segment of upper cover (1), corresponds to the notch (213) of rod (21) to strengthen the connection. Connected to the two extended rods (21) is a press board (5), exerting pressure onto the memory card linkage terminal of casing (2), assuring the perfect evenness of the linkage terminal, further enhancing the steadiness of the entire assembly.

To inspect or perform repair work on the linkage terminal inside of casing (2), it is only necessary to move the upper cover (1) or lower cover (4) to separate it from casing (2) and access to the target spot; replacing the entire unit is no longer the only option; it is therefore much more economical for the user and avoids waste of resources.

The present invention of Removable Casing for Memory Card features at least the following advantage:

1. It is easy to inspect and repair, therefore avoiding replacement cost due to minor defects.

2. It is more convenient for the user.

3. It improves and safeguards the evenness and steadiness of the linkage terminal, preventing deformation of the terminals through repeated use.

In summation, the present invention of Removable Casing for Memory Card is an innovative, progressive and highly utilitarian tool for the industry while said invention has never been applied in a similar product nor in any existing practices; further still, it has never been disclosed in any publications prior to this report. On this ground, we submit the Application and your consideration is much appreciated.

It is to be understood that the embodiment described herein is merely illustrative of the principles of the invention and that a wide variety of modifications thereto may be affected by persons skilled in the art without departing from the spirit and scope of the invention as set forth in the following claims.

What is claimed is:

1. A removable casing for memory card comprises:

an upper cover, a casing, a frontal cover and a lower cover wherein, the casing is fitted with a linkage terminal inside ready for connection to a memory card; the frontal segment of the casing is devised to receive the frontal cover while either side of casing extends to a rod for the upper and lower covers to match interlock; wherein top and bottom of the rod are fitted with a plurality of catch tracks while on either side of the top cover is at least one "U-shape" catch and on either side of the lower cover is at least one "Inverse L shape" catch; said catches are to correspond to the catch track for a match interlocking.

2. The removable casing for memory card of claim 1 wherein the frontal segment of rods is each formed into a notch.

3. The removable casing for memory card of claim 1 wherein the outer edge of rods is each formed into a slide track.

4. The removable casing for memory card of claim 1 wherein the inside edges of rods is connected to a press board.

* * * * *